United States Patent [19]
Bae

[11] Patent Number: 5,598,250
[45] Date of Patent: Jan. 28, 1997

[54] PREFABRICATED MODIFIED ILLUMINATION APPARATUS FOR FORMING FINE PATTERNS IN A SEMICONDUCTOR DEVICE

[75] Inventor: Sang M. Bae, Bubaleub, Rep. of Korea

[73] Assignee: Hyundai Electronics Industries Co., Ltd., Rep. of Korea

[21] Appl. No.: 400,045

[22] Filed: Mar. 7, 1995

[30] Foreign Application Priority Data

Mar. 7, 1994 [KR] Rep. of Korea .................... 1994-4394

[51] Int. Cl.$^6$ ............................ G03B 27/54; G03B 27/72
[52] U.S. Cl. ................................ 355/67; 355/71
[58] Field of Search .................................. 355/71, 67, 53

[56] References Cited

U.S. PATENT DOCUMENTS 5,264,898  11/1993  Kamon et al. ............................ 355/67

Primary Examiner—Arthur T. Grimley
Assistant Examiner—Herbert V. Kerner
Attorney, Agent, or Firm— Merchant, Gould, Smith, Edell, Welter & Schmidt

[57] ABSTRACT

A prefabricated modified illumination apparatus for forming fine patterns in a semiconductor device having a copper plate with a transmission hole in the center; a plurality of first blades for intercepting the light which transmits the transmission hole, the blades being controlled by an external power-driven machine so that first blades vary the area of the transmission hole second blades of a cross-bar type, at least one of which intercepts the light transmitting the transmission hole and is controlled by an external power-driven machine, to vary the area of the transmission hole, and third blades of a length-bar type, at least one of which intercepts the light transmitting the transmission hole and is controlled by an external power-driven machine, vary the area of the transmission hole, wherein the second blade is superimposed on the third blade in the area of the transmission hole.

6 Claims, 3 Drawing Sheets

PREFABRICATED MODIFIED ILLUMINATION APPARATUS FOR FORMING FINE PATTERNS IN A SEMICONDUCTOR DEVICE

BACKGROUND OF THE INVENTION

Field of the Invention

The present invention relates to a prefabricated modified illumination apparatus for forming fine patterns on a semiconductor device, and in particular, relates to a modified illumination apparatus which forms fine patterns by freely modifying the form of the illumination apparatus, thus improving the resolution of an image.

Generally, in a lithography process, the method of light exposure using modified illumination is capable of forming fine patterns using a formation of incidence of light.

In order to form fine patterns in the prior art, many different modified illumination apparatuses were specifically manufactured. Namely, to form patterns on a wafer having a photoresist layer on its surface, modified illumination apparatuses were appropriately selected so that the exact resolution for forming the fine patterns could be obtained.

Therefore, a variety of illumination apparatuses were made into fixed types before they were used. Then, they were selectively used in order to be suitable for the patterns desired in a semiconductor device.

Referring to FIGS. 1 and 2, a conventional illumination apparatus for forming fine patterns is described.

FIG. 1 is a schematic view illustrating a stepper having a conventional modified illumination apparatus, and FIG. 2 is a schematic view illustrating a structure of a conventional modified illumination apparatus. Numeral 1 denotes light, 2 a modified illumination apparatus, 3 a condenser lens, 4 a photomask, 5 a projection lens, 6 a wafer, 7 a copper plate, and 8 a transmission hole.

As shown in the drawings, light 1 from a mercury lamp passes through the modified illumination apparatus of a predetermined shape. The modified illumination apparatus, shown in FIG. 2, has a transmission hole 8 of a predetermined size in order for the light to transmit through to the copper plate 7. A cross shape in the transmission hole 8 increases the margin of resolution and the depth of focus increases by intercepting some of the light.

The transmitted light from the modified illumination apparatus transmits to a filter (not shown in the figure) which transmits light of a specific wavelength. The condenser lens 3 increases the light intensity, concentrating it on a portion. The condenser lens 3 can be moved back and forth to control the variation of the fine light intensity by controlling the focus of the lens in order to uniformly maintain the intensity of the light. If the light is projected through the photomask, having predetermined patterns on its surface, projection lens 5 shrinks the image. The photoresist layer is exposed so that the pattern is formed on a wafer. Then, a new illumination apparatus suitable for other pattern profiles is manufactured separately since the shape of each of the illumination apparatuses must be varied in accordance with the position of the mask and pattern density in the lithography process, which forms patterns on wafer 6 through a path such as stated above.

Also, since the conventional illumination apparatus is a fixed type confronted with the requirements of a variety of patterns, it is difficult to guarantee a variety illumination.

Furthermore, since each of the conventional illumination apparatuses are limited to one shape, use and selection of them is limited and adequate exposure of the wafer can not be insured.

Therefore many conventional illumination apparatuses were made to accommodate a variety of fine patterns, resulting in lost time, expense and space.

SUMMARY OF THE INVENTION

Therefore, an object of the present invention is to provide a prefabricated modified illumination apparatus which improves the resolution ability by freely modifying the shape of the illumination apparatus suitable for a variety of fine patterns formed on a mask.

In accordance with one aspect, there is provided a prefabricated modified illumination apparatus for forming fine patterns in a semiconductor device including: a copper plate having a transmission hole in the center; a plurality of first blades for intercepting the light which transmits through said transmission hole of said copper plate, the first blades being controlled by an external power-driven machine so that said plurality of first blades varies the area of said transmission hole of said outer copper plate; second blades of a cross-bar type, at least one of which intercepts light transmitting through said transmission hole of said copper plate, the second blades being controlled by an external power-driven machine so that said second blades vary the area of said transmission hole of said copper plate; and third blades of a length-bar type, at least one of which intercepts light transmitting through said transmission hole of said copper plate, the third blades being controlled by an external power-driven machine so that said third blades vary the area of said transmission hole of said copper plate, wherein said second blades are superimposed on said third blades in the area of said transmission hole of said copper plate.

BRIEF DESCRIPTION OF THE DRAWINGS

Other objects and aspects of the present invention will become apparent from the following description of the preferred embodiment with reference to the accompanying drawings in which.

DETAILED DESCRIPTION OF THE PREFERRED EMBODIMENT

Figure 1:
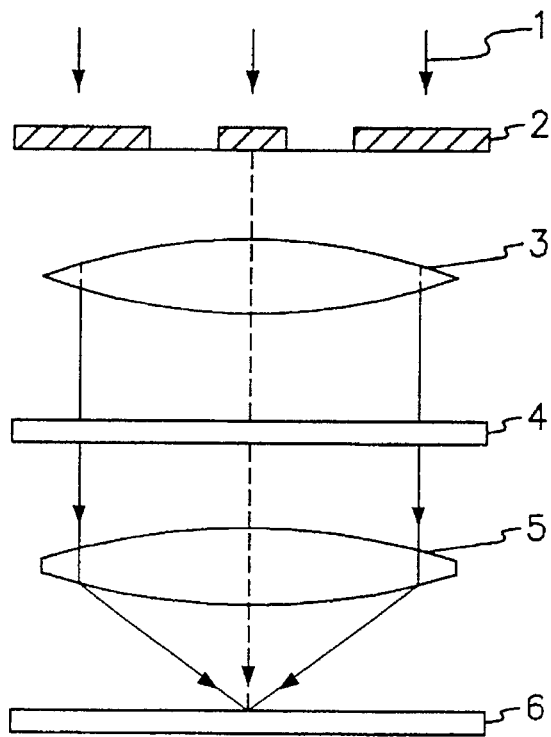
FIG. 1 is a schematic view showing a stepper having a conventional modified illumination apparatus.
Figure 2:
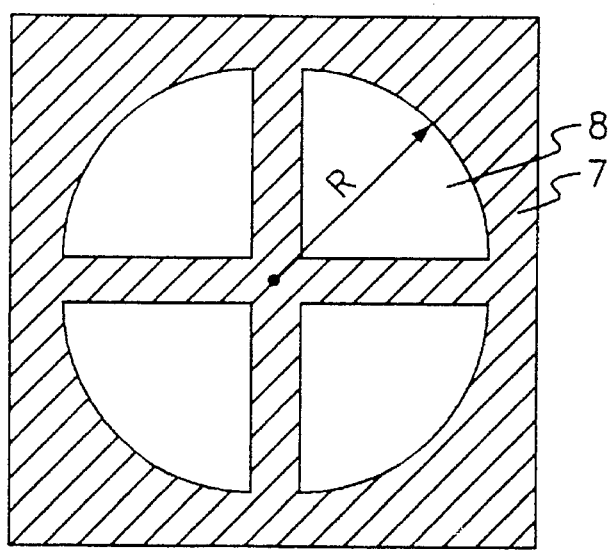
FIG. 2 is a schematic view showing a structure of a conventional modified illumination apparatus.
Figure 3:
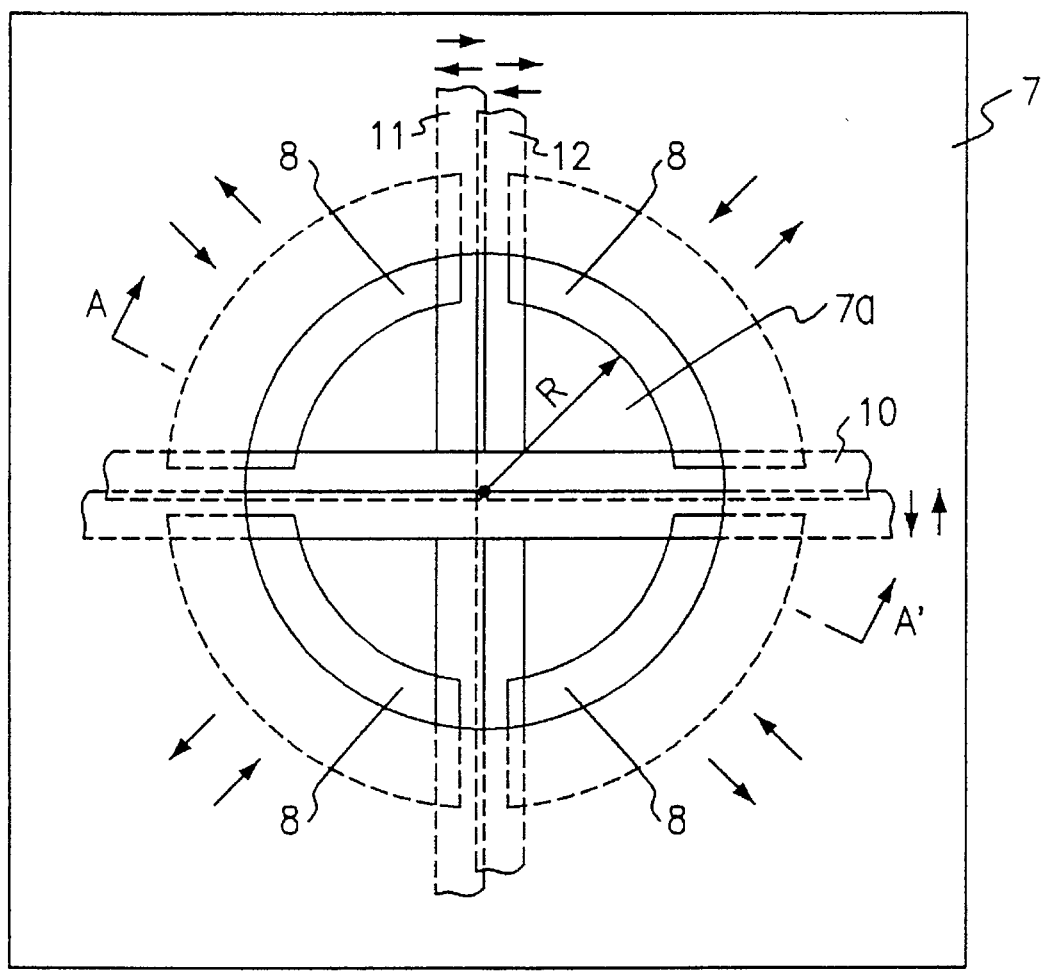
FIG. 3 is a front view illustrating an embodiment of a modified illumination apparatus according to the present invention.
Figure 4:
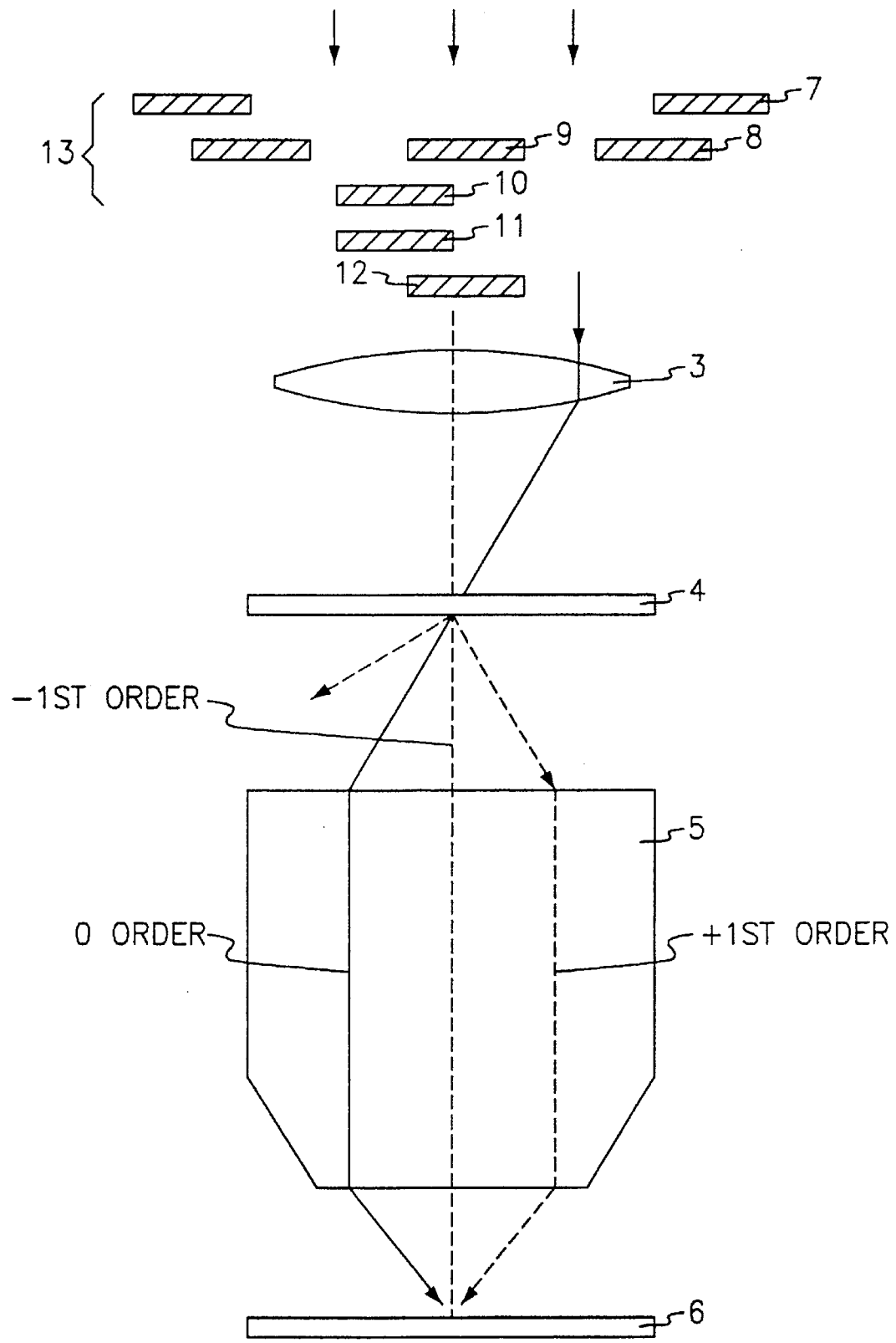
FIG. 4 is a schematic view illustrating a stepper using a modified illumination apparatus according to the present invention.

Referring to FIG. 3 and FIG. 4, an embodiment of the present invention is illustrated in detail. FIG. 3 is a front view illustrating an embodiment of a modified illumination apparatus according to the present invention. FIG. 4 is a schematic view illustrating a stepper using a modified illumination apparatus according to the present invention.

Numeral 7 denotes an outer copper plate, 7a a transmission hole, 8 a blade of the transmission hole, 9 and 10 inner blades of a movable cross-bar type, 11 and 12 inner blades of a movable length-bar type, and 13 (see FIG. 4) a modified illumination apparatus which shows a cross-sectional view according to A—A' line (see FIG. 3), respectively.

A prefabricated modified illumination apparatus of the present invention is part of a stepper which is used to make mask patterns in a lithography process and it is made into a changeable type, thus improving the resolution of the stepper.

It is set between fly-eye lens and condenser lens to form fine patterns. As shown in FIG. 3, apparatus 13 includes transmission hole 7a cut in a circular shape from the center of the outer copper plate 7 in a predetermined size.

In the preferred embodiment of the present invention, the blades 8 of the transmission hole 7a number four, and are movable to the left or the right side in a diagonal direction. Blades 8 can vary a radius by means of shielding a predetermined portion of the radius of transmission hole 7a. Accordingly, the variation of the blades 8 of transmission hole 7a changes the numerical aperture(NA) and the coherence factor of light through the stepper which then exposes the wafer 6 to the light of the stepper.

Also, the inner blades on the upper portion and the lower portion of the movable cross-bar type, having a predetermined size, are superimposed in a predetermined width along a cross axis.

Similarly, the inner blades on the upper portion and the lower portion of the movable cross-bar type are superimposed along a length axis.

The inner blades of the cross-bar type 9 and 10 and the inner blades of the length bar type 11 and 12 are movable towards the top, bottom, left and right, in accordance with the position and profile of the patterns on the wafer.

In the above structure, if the width of the inner blades of the cross-bar type 9 and 10 are fixed and the width of the inner blades of the length-bar type 11 and 12 are modified, the resolution and the depth of focus (D.O.F) of the patterns are improved in the Y axis direction on the wafer. On the contrary, when the patterns on the wafer are in the X axis direction and the inner blades of the length-bar type 11 and 12 are fixed, the resolution and the depth of focus(D.O.F) in the X axis direction will be improved by modifying the width of the inner blades of the cross-bar type 9 and 10

The blades 8 of the transmission hole 7a, the inner blades of the cross-bar type 9 and 10 and the inner blades of the length-bar type 11 and 12 can be moved by using an external physical force and/or using a power-driven machine.

Referring to FIG. 4, an exposure using the above modified illumination apparatus is described.

As shown in FIG. 4, the blades 8 of the transmission hole, which are included in the modified illumination apparatus 13 are controlled by an external power-driven machine, and the inner blades of the cross-bar type 9 and 10 and the inner blades of the length-bar type 11 and 12 are, in turn, controlled to the top, bottom, left and right.

The specific wavelength of the light, which is transmitted between the blades, is absorbed in a filter(not shown) and the light which transmits through the filter converges on the condenser lens which controls the light intensity. The shape of the light which transmits through the modified illumination apparatus 13 is square with the patterns on the wafer.

Furthermore, the light transmitting the condenser lens 3 is diffracted in accordance with the shape of the Cr patterns on the photomask 4. The diffraction light is miniatured by the projection lens 5.

The light transmitting through the projection lens 5 reacts upon the photoresist on the wafer and forms the fine patterns.

Illumination regions are controlled by making the external power-driven machine move the copper plate at the time of exposure.

As apparent from the above description, since the present invention improves the resolution of the image, preferably using the modified illumination apparatus according to the patterns on the mask, it is not necessary to use fixed illumination apparatus.

The present invention has the effect of saving time and expense through simple manufacture of the modified illumination apparatus.

What is claimed is:

1. A prefabricated modified illumination apparatus for forming fine patterns in a semiconductor device comprising:

a plate having a transmission hole in the center;

a plurality of first blades for intercepting light which transmits through said transmission hole of said plate, said blades being radially moveable and being controlled by an external power-driven machine so that said plurality of first blades varies the area of said transmission hole;

a plurality of second blades of a cross-bar type, which intercept light transmitting through said transmission hole, said second blades being moveable toward and away from one another and being controlled by said external power-driven machine so that said second blades vary the area of said transmission hole; and a plurality of third blades of a length-bar type, which intercept light transmitting through said transmission hole, said third blades being moveable toward and away from one another and being controlled by said external power-driven machine so that said third blades vary the area of said transmission hole, wherein said second blades are superimposed on said third blades in the area of said transmission hole.

2. A prefabricated modified illumination apparatus in accordance with claim 1, wherein each of said first blades, said second blades of a cross-bar type, and said third blades of a length-bar type are arrayed like the shape of the patterns on a photomask.

3. A prefabricated modified illumination apparatus in accordance with claim 1, wherein each of said first blades are in a fan shape.

4. A prefabricated modified illumination apparatus in accordance with claim 1, wherein each of said first blades move in a diagonal direction.

5. A prefabricated modified illumination apparatus in accordance with claim 1, wherein said second blades move in a cross direction.

6. A prefabricated modified illumination apparatus in accordance with claim 1, wherein said third blades move in a length direction.

* * * * *